(12) United States Patent
Mochizuki et al.

(10) Patent No.: US 12,364,032 B2
(45) Date of Patent: Jul. 15, 2025

(54) SEMICONDUCTOR DEVICE

(71) Applicant: Japan Display Inc., Tokyo (JP)

(72) Inventors: Marina Mochizuki, Tokyo (JP); Isao Suzumura, Tokyo (JP)

(73) Assignee: Japan Display Inc., Tokyo (JP)

( * ) Notice: Subject to any disclaimer, the term of this patent is extended or adjusted under 35 U.S.C. 154(b) by 518 days.

(21) Appl. No.: 17/830,403

(22) Filed: Jun. 2, 2022

(65) Prior Publication Data

US 2022/0293663 A1 Sep. 15, 2022

Related U.S. Application Data

(63) Continuation of application No. PCT/JP2020/041532, filed on Nov. 6, 2020.

(30) Foreign Application Priority Data

Dec. 4, 2019 (JP) ................. 2019-219253

(51) Int. Cl.
*H10F 39/18* (2025.01)
*H10F 39/00* (2025.01)
*H10D 30/67* (2025.01)

(52) U.S. Cl.
CPC .......... *H10F 39/18* (2025.01); *H10F 39/014* (2025.01); *H10F 39/016* (2025.01); *H10F 39/80377* (2025.01); *H10D 30/6755* (2025.01)

(58) Field of Classification Search
CPC ......... H01L 27/14643; H01L 27/14616; H01L 27/14689; H01L 27/14692; H01L 29/7869;

(Continued)

(56) References Cited

U.S. PATENT DOCUMENTS 11,843,022 B2 * 12/2023 Takita ............... H01L 27/14663
11,916,094 B2 * 2/2024 Moriwaki ......... H01L 27/14689
(Continued)

FOREIGN PATENT DOCUMENTS

JP H02-159772 A 6/1990
JP H06-314779 A 11/1994
(Continued)

OTHER PUBLICATIONS

Japanese Office Action dated Oct. 3, 2023 for the corresponding Japanese Application No. 2019-219253, with English machine translation.

(Continued)

*Primary Examiner* — Nathan W Ha
(74) *Attorney, Agent, or Firm* — Michael Best & Friedrich LLP

(57) ABSTRACT

A purpose of the present invention is to countermeasure a connection failure of an electrode in an optical sensor using PIN type photo conductive film. A structure of the present invention is as follows. A semiconductor device including an optical sensor, the optical sensor including: a thin film transistor formed on a substrate, and a photo diode formed above the thin film transistor, in which the photo diode includes an anode, a photo conductive film and a cathode, the cathode is constituted from a titanium film, and a first transparent conductive film is formed between the titanium film and the photo conductive film.

18 Claims, 17 Drawing Sheets

(58) Field of Classification Search
 CPC ............... H10F 39/18; H10F 39/016; H10F 39/80377; H10F 39/014
 See application file for complete search history.

(56) References Cited

U.S. PATENT DOCUMENTS

| | | | |
|---|---|---|---|
| 2006/0124932 A1* | 6/2006 | Joo | H01L 27/1214 257/E27.111 |
| 2008/0237474 A1 | 10/2008 | Tonotani et al. | |
| 2011/0303853 A1* | 12/2011 | Jung | H04N 25/671 250/371 |
| 2017/0054097 A1 | 2/2017 | O'Rourke et al. | |
| 2017/0179199 A1* | 6/2017 | Rodriquez | H10K 30/81 |
| 2019/0170884 A1 | 6/2019 | Misaki | |
| 2020/0075678 A1* | 3/2020 | Rodriquez | H10K 30/30 |
| 2021/0280569 A1* | 9/2021 | You | G06V 40/1318 |

FOREIGN PATENT DOCUMENTS

| | | |
|---|---|---|
| JP | 2008-244251 A | 10/2008 |
| JP | 2018-533193 A | 11/2018 |
| WO | 2017/031109 A1 | 2/2017 |
| WO | 2018/025819 A1 | 2/2018 |

OTHER PUBLICATIONS

German Office Action received on Apr. 30, 2024 for the corresponding German Patent Application No. 11 2020 005 248.6, with English machine translation.

International Search Report mailed on Jan. 26, 2021, for the PCT Application No. PCT/JP2020/041532, with English machine translation.

* cited by examiner

A-A

B-B

SEMICONDUCTOR DEVICE

The present application is a continuation application of International Application No. PCT/JP2020/041532, filed Nov. 6, 2020, which claims priority to Japanese Patent Application No. 2019-219253, filed Dec. 4, 2019. The contents of these applications axe incorporated herein by reference in their entirety.

BACKGROUND OF THE INVENTION

(1) Field of the Invention

The present invention relates to a semiconductor device having an optical sensor using a photoelectric conversion element.

(2) Description of the Related Art

Optical sensors utilizing photoelectric conversion have been used in fields such as biometric authentication as well as image recognition, and their use has spread. In the PIN photodiode, an intrinsic layer is interposed between a p+ layer and a n+ layer, a response speed is excellent, and a dark current is small, so that a large S/N ratio can be obtained.

The vertical mode PIN photo sensor which uses a-Si is described in Patent document 1. Patent Document 2 discloses an example in which a PIN photodiode in a planar structure is used as an image sensor.

PRIOR ART REFERENCE

Patent Document

[Patent document 1] Japanese Patent Application Publication No. Hei 2-159772 A
[Patent document 2] Japanese Patent Application Publication No. Hei 6-314779 A

SUMMARY OF THE INVENTION

When a photodiode is used as a planar image sensor, a switching TFT or a driving TFT is formed by a TFT (Thin Film Transistor) together with a photodiode. In addition, a power supply line, a detection line, a scanning line, and the like are necessary for supplying power to the photodiode or detecting an output from the photodiode.

A thin film is used for an electrode connected to a photodiode. On the other hand, a switching TFT and a driving circuit are disposed adjacent to the photodiode or below the photodiode, so that unevenness tends to occur in the region where the photodiode is formed. Accordingly, due to irregularities, a step disconnection occurs in the conductive film connected to the photodiode, thereby impairing reliability as a sensor.

A purpose of the present invention is to realize a highly reliable photo sensor by preventing unevenness occurring in the vicinity of a photodiode and preventing a step disconnection of an electrode connected to a photodiode.

The present invention solves the above problems, and the main specific means thereof is as follows.

(1) A semiconductor device including an optical sensor, the optical sensor including: a thin film transistor formed on a substrate, and a photo diode formed above the thin film transistor, in which the photo diode includes an anode, a photo conductive film and a cathode, the cathode is constituted from a titanium film, and a first transparent conductive film is formed between the titanium film and the photo conductive film.

(2) A semiconductor device including an optical sensor, the optical sensor including: a thin film transistor formed on a substrate, and a photo diode formed above the thin film transistor, in which the photo diode includes an anode, a photo conductive film and a cathode, the cathode is constituted from a titanium film, the titanium film contacts a first transparent conductive film, and the titanium film is formed between the first transparent conductive film and the photo conductive film.

(3) A semiconductor device including an optical sensor, the optical sensor including: a thin film transistor formed on a substrate, and a photo diode formed above the thin film transistor, in which the photo diode includes an anode, a photo conductive film and a cathode, a first organic passivation film is formed covering a part of the anode, and the connecting electrode, which extends on the first organic passivation film, connects to the anode.

DETAILED DESCRIPTION OF THE PREFERRED EMBODIMENTS

Figure 1:
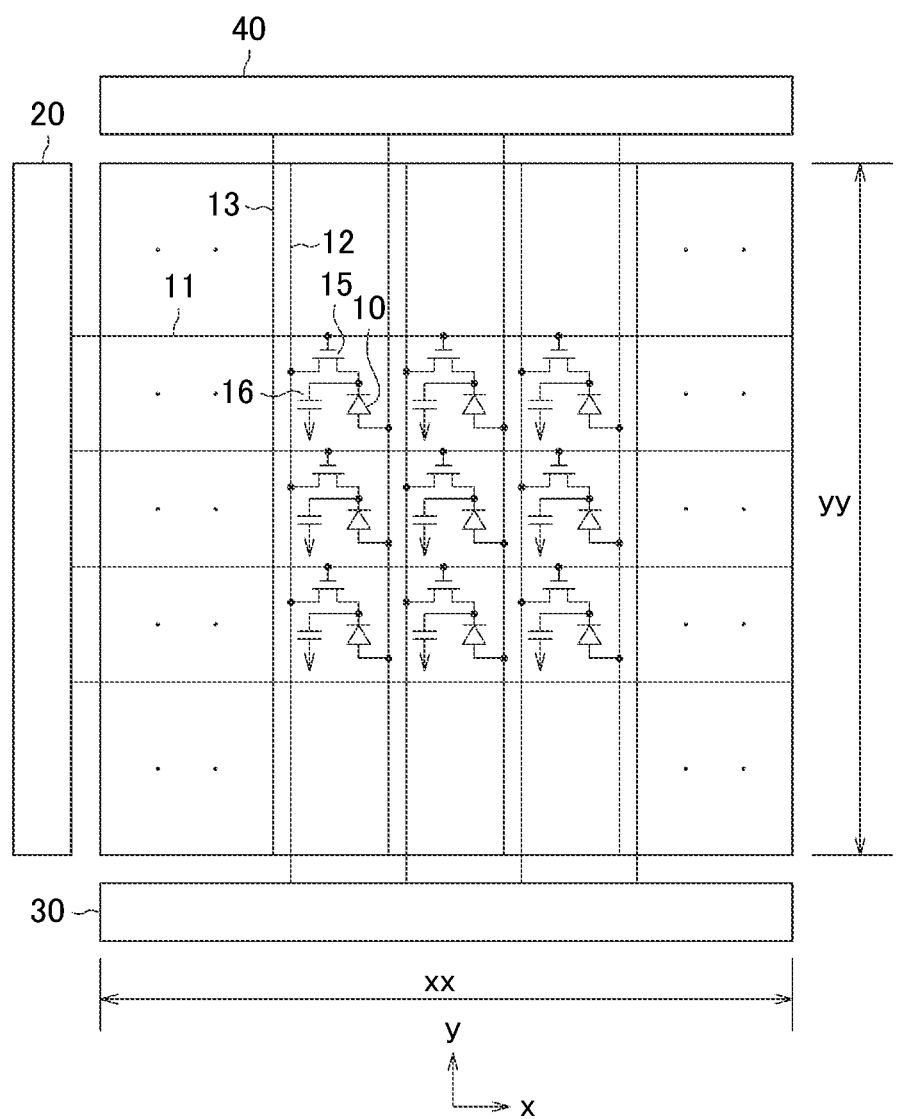
FIG. 1 is a plan view of an optical sensor.

FIG. 1 is a plan view of an optical sensor device to which the present invention is applied. In FIG. 1, sensor elements are formed in a matrix in the sensor region. For example, the sensor area has a lateral diameter xx of 3 cm and a vertical diameter yy of 3 cm. In the sensor region, scanning lines 11 extend in the horizontal direction (x-direction) and are arranged in the vertical direction (y-direction). A detection line 12 and a power supply line 13 extend in the vertical direction and are arranged in the horizontal direction. A region surrounded by a scanning line 11 and a detection line 12, or a region surrounded by a scanning line 11 and a power line 13 constitutes a sensor element. A switching TFT 15, a PIN photoconductive film diode 10, and a storage capacitor 16 are formed in each sensor element. One electrode of the storage capacitor 16 is connected to the source of the TFT 15, and the other electrode is connected to, for example, a reference potential.

A scanning line driving circuit 20 is disposed in the lateral direction outside the sensor region, a power supply circuit 40 is disposed in the upward direction, and a detection circuit 30 is disposed in the downward direction. The scanning line driving circuit 20 and the detection circuit 30 are formed of TFTs. The scanning line 11 is sequentially selected from the upper portion by the shift register in the scanning line driving circuit 20.

The power supply line 13 is connected to an anode of each photodiode, extends in the vertical direction, and is connected to the same power supply in the power supply circuit 40 above the sensor region. Then, an anode potential is supplied to the power supply line 13. The detection line 12 is connected to the drain of the switching TFT, and the source of the switching TFT is connected to the cathode of the photodiode 10. A detection line 12 extends downward from each sensor element, and a photocurrent is detected in the detection circuit 30. In FIG. 1, when light is applied to the sensor element selected by the scanning line 11, a photocurrent is generated from the photodiode 10, and this photocurrent is detected by the detection circuit 30 through the detection line 12.

Figure 2:
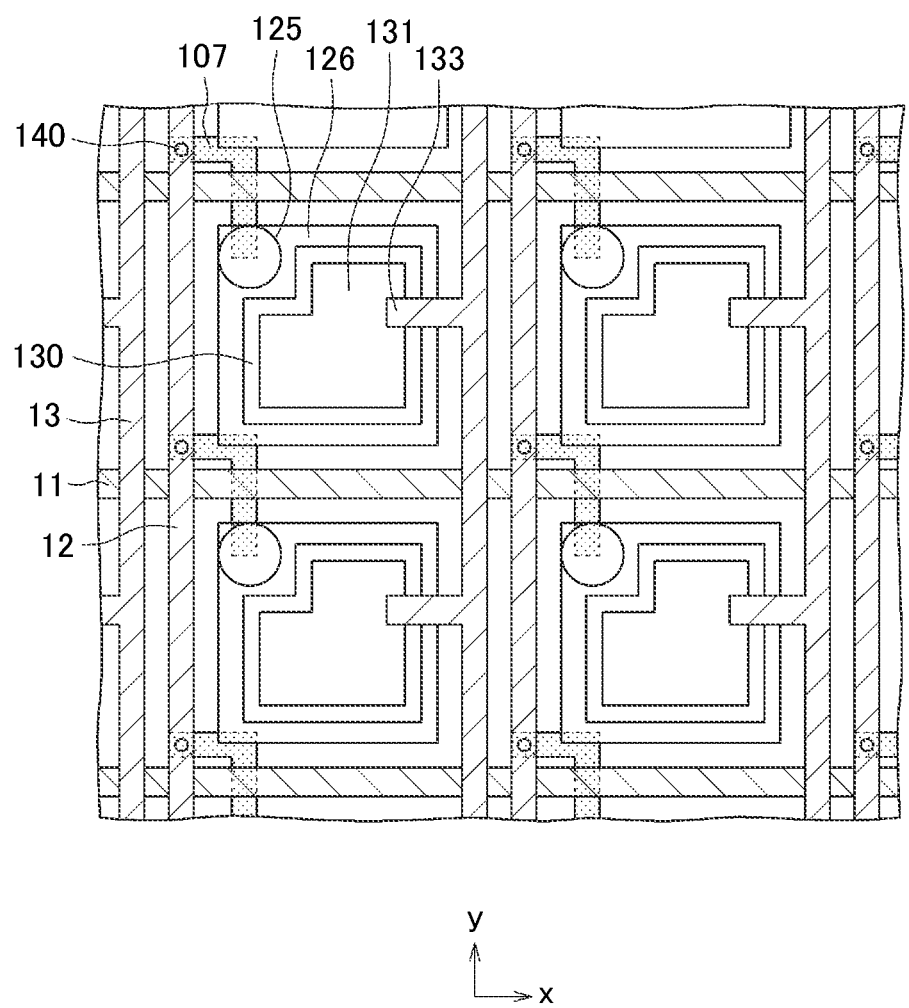
FIG. 2 is a plan view of an optical sensor element.

FIG. 2 is a plan view of each sensor element. In order not to complicate the drawing, some electrodes or the like are omitted from FIG. 2. The size of each sensor element is, for example, 50 μm in the lateral direction and 50 μm in the vertical direction. In FIG. 2, the scanning lines 11 extend in the horizontal direction (x-direction) and are arranged in the vertical direction (y-direction). Further, the power supply line 13 and the detection line 12 extend in the vertical direction and are arranged in the horizontal direction. A cathode 126 of a photodiode, a photoconductive film 130, an anode 131, and the like are formed in a region surrounded by a scanning line 11 and a power supply line 13, or in a region surrounded by a scanning line 11 and a detection line 12.

The semiconductor film 107 extends in the x direction from the detection line 12 through the through hole 140 and passes under the scan line 11. At this time, a TFT is formed. In this case, the scanning line 11 becomes the gate electrode of the TFT. The semiconductor film 107 extends in the y direction and is connected to the cathode 126 of the photodiode formed of titanium (Ti) in the through hole 125. As described in FIG. 3, the through hole 125 is formed in a thick organic passivation film, so that the diameter thereof is large. A photoconductive film 130 is formed on the cathode 126, and an anode 131 is formed of ITO (Indium Tin Oxide) on top of the film. Thus, a photodiode is formed.

In FIG. 2, a power is supplied to the photodiode by the connection electrode 133 between the anode 131 and the power supply line 13. The power supply line 13 may extend directly to the power supply circuit 40 on the surface of the insulating film, or may be extended to the same layer as the drain electrode of the TFT or the same layer as the source electrode via a through hole.

Figure 3:
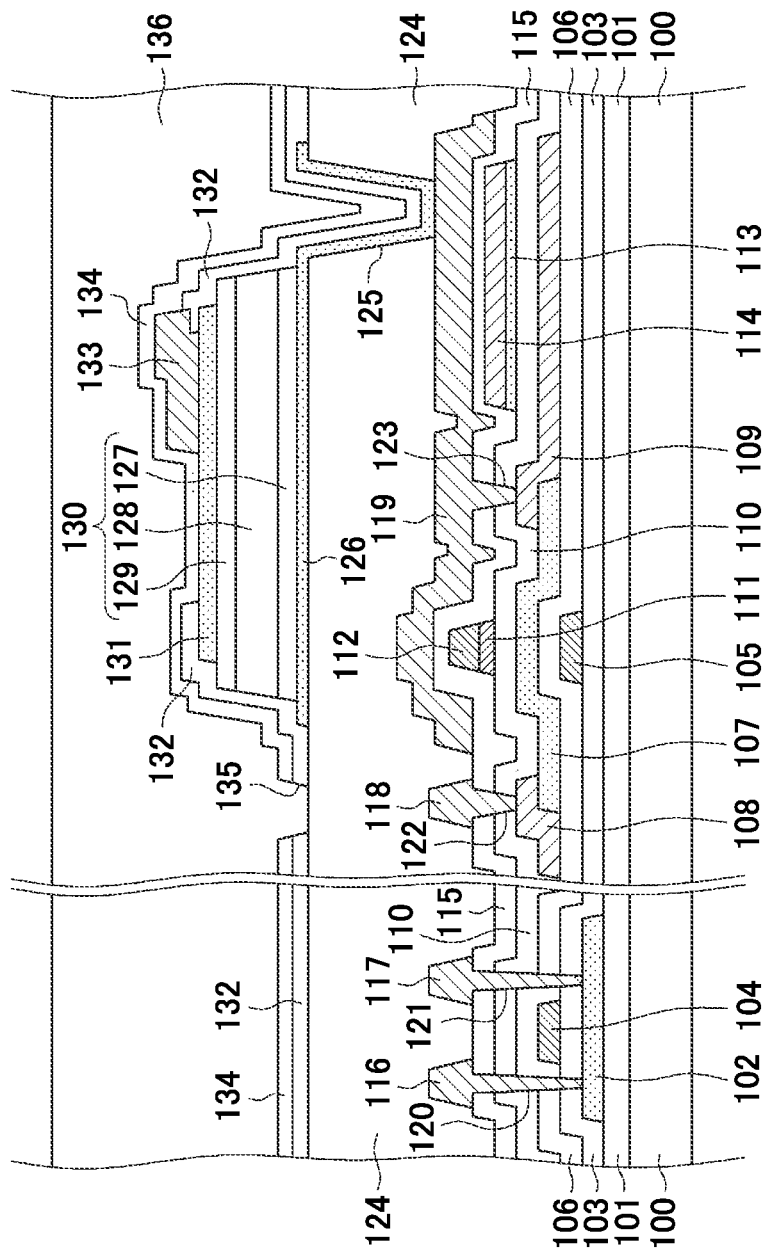
FIG. 3 is a cross sectional view of the optical sensor.

FIG. 3 is a cross-sectional view of the optical sensor device of FIG. 1. In the optical sensor shown in FIG. 3, light is input from the side opposite to the substrate 100, i.e., from the anode 131 side. As shown in FIG. 1, a driving circuit formed of a TFT is formed outside the sensor region. Since a polysilicon semiconductor has a large mobility, it is advantageous that the TFT constituting the drive circuit is formed of a polysilicon semiconductor.

On the other hand, it is advantageous that the switching TFT formed in the sensor region is formed of an oxide semiconductor (sometimes referred to as OS: Oxide Semiconductor) having a small leakage current. Therefore, in this embodiment, a hybrid array substrate using both of a polysilicon semiconductor TFT and an oxide semiconductor TFT is used. In FIG. 3, the left side is a polysilicon TFT for a peripheral circuit, and the central portion is a PIN photodiode and a switching TFT therefor.

Polysilicon is a so-called low-temperature polysilicon in which a-Si is poly siliconized by an excimer laser. Nevertheless, since an annealing temperature of a polysilicon semiconductor exceeds a process temperature for forming an oxide semiconductor, a polysilicon semiconductor TFT is formed initially, and then an oxide semiconductor TFT is formed. Thus, a peripheral circuit is formed initially.

In FIG. 3, a base film 101 made of a laminated film of silicon nitride (SiN) and silicon oxide (SiO) is formed on a glass substrate 100. This is for preventing the polysilicon semiconductor 102 and the oxide semiconductor 107 from being contaminated by impurities from the glass substrate 100. The thickness of the SiO film is, for example, 200 nm, and the thickness of the SiN film is, for example, 20 nm.

On top of the base film 101, a polysilicon film 102 is formed. In the polysilicon film 102, an a-Si film is first formed, and then a-Si is converted into polysilicon by an excimer laser and patterned. The thickness of the polysilicon film 102 is, for example, 50 nm. Note that the SiO film and the SiN film, serving as the base film 101, and the a-Si film can be continuously formed by CVD.

Thereafter, the first gate insulating film 103 is formed of SiO covering the polysilicon semiconductor film 102. A thickness of the first gate insulating film 103 is, for example, 100 nm. Then, a first gate electrode 104 is formed by metal or metal alloy. The first gate electrode 104 is formed of MoW, for example. Incidentally, the peripheral circuit region and the sensor region are formed simultaneously. At the same time as forming the first gate electrode 104, a light shielding film 105 is formed of the same material as the first gate electrode 104 in a portion corresponding to the switching TFT in the sensor region. This light shielding film 105 can be used as a bottom gate electrode of an oxide semiconductor TFT to be formed later.

A first interlayer insulating film 106 is formed of a stacked film of a SiO film and a SiN film covering the first gate electrode 104 and the light shielding film 105. For example, the SiN film has a thickness of 300 nm and the SiO film has a thickness of 200 nm. An oxide semiconductor film 107 is formed over the first interlayer insulating film 106. As an oxide semiconductor, IGZO (Indium Gallium Zinc Oxide), ITZO (Indium Tin Zinc Oxide), ZnON (Zinc Oxide Nitride), and IGO (Indium Gallium Oxide) are used. In this embodiment, IGZO is used as an oxide semiconductor.

In order to maintain characteristics of an oxide semiconductor, it is important to maintain an oxygen amount. Therefore, the upper layer of the first interlayer insulating film 106 needs to be a SiO film. This is because SiN supplies hydrogen and reduces the oxide semiconductor. If the SiO film is in contact with the oxide semiconductor film 107, oxygen can be supplied from the SiO film to the oxide semiconductor.

A drain protective electrode 108 is stacked in a drain region of the oxide semiconductor film 107, and a source protective electrode 109 is formed in a source region thereof. The drain protection electrode 108 and the source protection electrode 109 are formed of a metal, and prevent the oxide semiconductor film 107 from being lost by hydrofluoric acid (HF) in the through holes on the oxide semiconductor TFT side when the through holes in the polysilicon TFT side are cleaned with the hydrofluoric acid (HF).

A second gate insulating film 110 is formed of a SiO film covering the oxide semiconductor film 107. The thickness of the SiO film is about 100 nm. A gate alumina film 111 is formed on the SiO film 110, and a second gate electrode 112 is formed thereon, by e.g., a MoW alloy. By supplying oxygen to the oxide semiconductor film 107 from the second gate insulating film 110 formed of SiO and the gate alumina film 111, the characteristics of the oxide semiconductor film 107 are stabilized.

In this embodiment, a storage capacitor is formed through the second gate insulating film 110 and the capacitance alumina (AlOx) film 113 by extending the source protection electrode 109 and forming the capacitor electrode 114 having the same structure as the gate electrode 112 at the opposing portion. The capacitance alumina (AlOx) film 113 and the capacitor electrode 114 are formed simultaneously with the gate alumina film 111 and the gate electrode 112. Since the thickness of the capacitance alumina (AlOx) film 113 is 10 nm or less, there is little effect on the value of the capacitance.

A second interlayer insulating film 115 is formed of a laminated film of a SiO film and a SiN film covering the second gate electrode 112 and the capacitor electrode 114. The thickness of the SiO film is, for example, 300 nm, and the thickness of the SiN film is, for example, 100 nm. In many cases, a SiO film is disposed on the lower side closer to the oxide semiconductor film 107. After forming the second interlayer insulating film 115, through holes 120 and 121 are formed on the polysilicon TFT side of the peripheral circuit, and through holes 122 and 123 are simultaneously formed on the oxide semiconductor TFT side on the sensor region side.

The through-holes 120 and 121 on the side of the polysilicon TFT are subjected to hydrofluoric acid (HF) cleaning in order to remove the oxide film. At this time, hydrofluoric acid (HF) is also introduced into the through holes 122 and 123 on the oxide semiconductor TFT side, and the drain protective electrode 108 and the source protective metallic film 109 are used in order to prevent the oxide semiconductor film 107 from being lost.

A first drain electrode 116 and a first source electrode 117 are formed corresponding to the through holes 120 and 121 on the polysilicon TFT side; a second drain electrode 118 and a second source electrode 119 are formed corresponding to the through holes 122 and 123 on the oxide semiconductor TFT side. The second drain electrode 118 is connected to the detection line 12. The first drain electrode 116, the first source electrode 117, the second drain electrode 118, the second source electrode 119, and the like are formed of a stacked film of Ti, Al, and Ti, and each thickness is, for example, a 50 nm, 450 nm, and 50 nm sequentially from the lower layer.

An organic passivation film 124 is formed of, for example, acrylic resin covering the second interlayer insulating film 115. Since the organic passivation film 124 also serves as a planarization film, it is formed to have a thickness of about 2 μm. In the organic passivation film 124, a through hole 125 is formed corresponding to a source electrode 119 of the TFT for connecting the source electrode 119 with the cathode 126 of the photodiode. Since the thickness of the organic passivation film 124 is large, the diameter of the through hole 125 is also large.

A cathode 126 is formed on the organic passivation film 124 by Ti. The cathode 126 has a thickness of about 100 nm and extends into the through hole 125 of the organic passivation film 124. A PIN film 130 is formed on the cathode 126. The PIN film 130 has a structure in which an n+ layer 127 is formed on a cathode 126 with a thickness of about 40 nm, an i-layer (a-Si layer) 128 is formed on the n+ layer 127 with a thickness of 600 nm, and a p+ layer 129 is formed on the i-layer (a-Si layer) 128 with a thickness of 30 nm. Note that these values of the PIN film 130 are examples. The n+ layer 127, the i layer 128, and the p+ layer 129 are all formed of a-Si. All of them can be continuously formed by CVD. Hereinafter, the PIN film 130 (photoconductive film 130) may be simply referred to as an a-Si film 130.

An ITO film 131 as an anode is formed on the p+ layer 129, for example, with a thickness of 50 nm. Thereafter, in order to prevent electrical leakage, the third interlayer insulating film 132 is formed of SiN, for example. A hole is formed on the surface of the anode 131 in the third interlayer insulating film 132, and the anode potential can be supplied from this portion via the power line 13 and the connecting electrode 133.

In FIG. 3, a connection electrode 133 formed simultaneously with the power supply line 13 extends over the third interlayer insulating film 132, and is connected to the anode 131 in the hole of the third interlayer insulating film 132, and supplies an anode potential to the photodiode. The connection electrode 133 is formed of a stacked structure of a Ti film having a thickness of 100 nm, an aluminum film having a thickness of 300 nm, and a Ti film having a thickness of 100 nm.

An inorganic passivation film 134 is formed of SiN, for example, covering the connection electrode 133, the anode 131, the third interlayer insulating film 132, and the like. In FIG. 3, the organic passivation film 124 is covered with the third interlayer insulating film 132 and the inorganic passivation film 134 at portions other than the cathode 126. The organic passivation film 124 absorbs moisture from atmosphere during the process. When this moisture is released from the organic passivation film 124 during operation, film peeling or the like is caused. Then, a drain hole 135 is formed in the third interlayer insulating film 132 and the inorganic passivation film 134 covering the organic passivation film 124 so that moisture contained in the organic passivation film 124 can be released.

As described above, the optical sensor device is completed, but in this state, since the surface is a SiN film 134 having a thickness of about 200 nm, the mechanical strength is not enough. Therefore, in order to mechanically protect the optical sensor, an organic protective film 136 may be formed on the inorganic passivation film 134. The organic protective film 136 is formed of, for example, an acrylic resin, and has a thickness of, for example, 2 μm.

Figure 4:
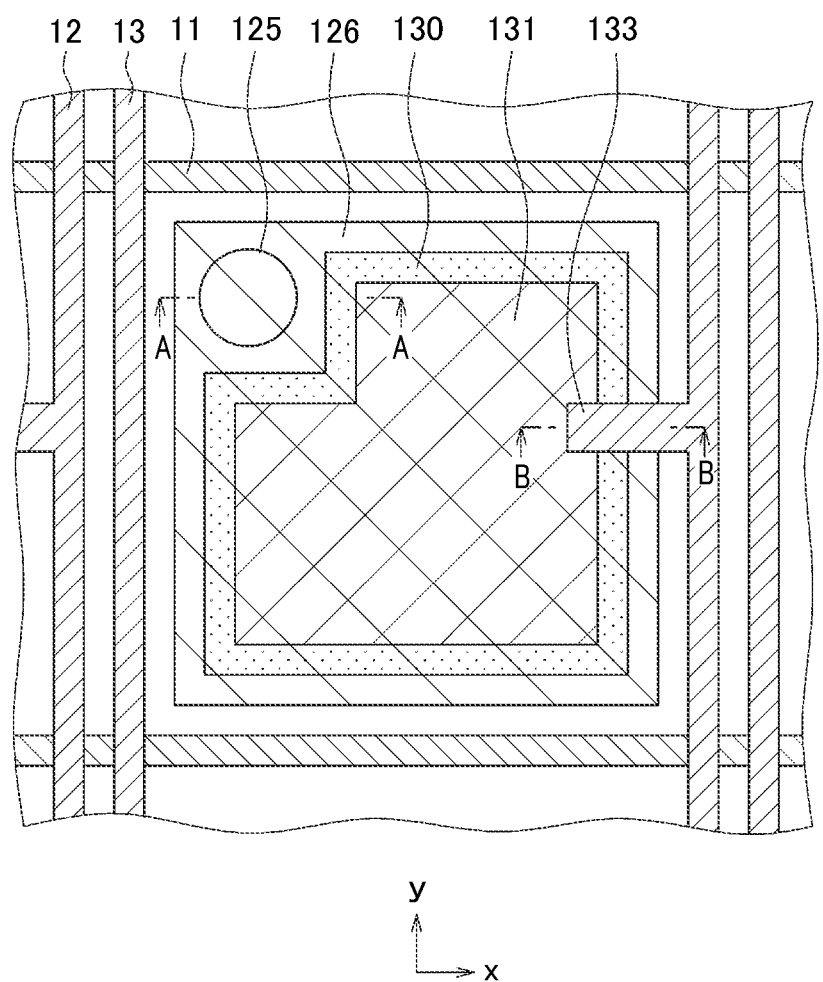
FIG. 4 is a detailed plan view of problematic portions of the optical sensor element.

FIG. 4 is a plan view of a sensor element. In FIG. 4, the TFT is omitted. In FIG. 4, a sensor element is formed in an area surrounded by the detection line 12, the power supply line 13, and the scanning line 11. In FIG. 4, a cathode 126 is formed of Ti covering a through-hole 125 formed in an organic passivation film 124. A photoconductive film 130 made of a-Si and having a PIN structure is formed on a cathode 126, and an anode 131 is formed of ITO on the photoconductive film 130. Then, a connection electrode 133 extends from the power supply line 13 on the anode 131, and supplies a potential to the anode 131. In FIG. 4, the portion A-A and the portion B-B are portions of the problem to be solved by the present invention.

Figure 5:
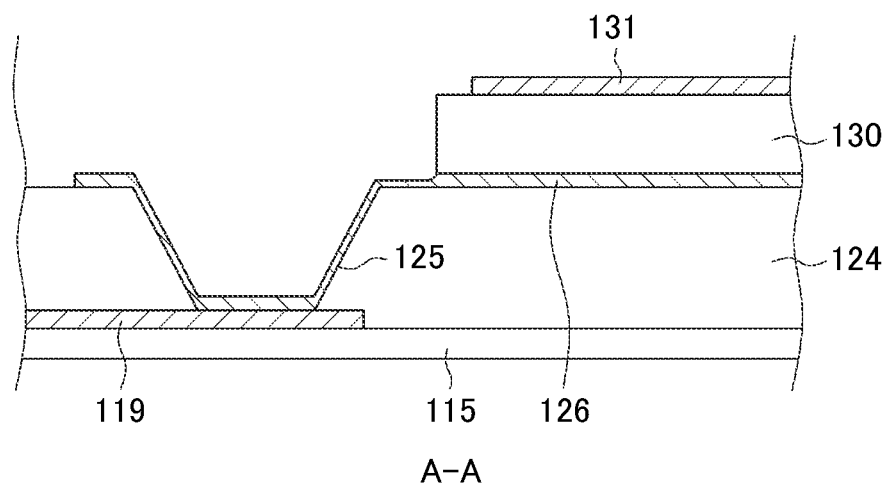
FIG. 5 is a cross-sectional view along the line A-A of FIG. 4.

FIG. 5 is a cross-sectional view taken along line A-A of FIG. 4, which is a first problem to be solved by the present invention. In FIG. 5, other than the layer of the problematic portion is omitted. In FIG. 5, a source electrode 119 is formed on the second interlayer insulating film 115, and the source electrode 119 is connected to a cathode 126 formed of Ti via a through hole 125 formed in the organic passivation film 124. An a-Si film 130 as a photoconductive film (PIN film) is formed on a cathode 126, and an anode 131 formed of ITO is formed thereon.

In FIG. 5, the a-Si film 130 which is a photoconductive film is formed by dry etching, but at this time, since the etching selectivity between the a-Si film 130 and the Ti film 126 (cathode 126) is small, the Ti film as the cathode 126 is also etched, and the cathode 126 is thinned. Then, in particular, in the through-hole 125, the cathode 126 is broken.

Figure 6:
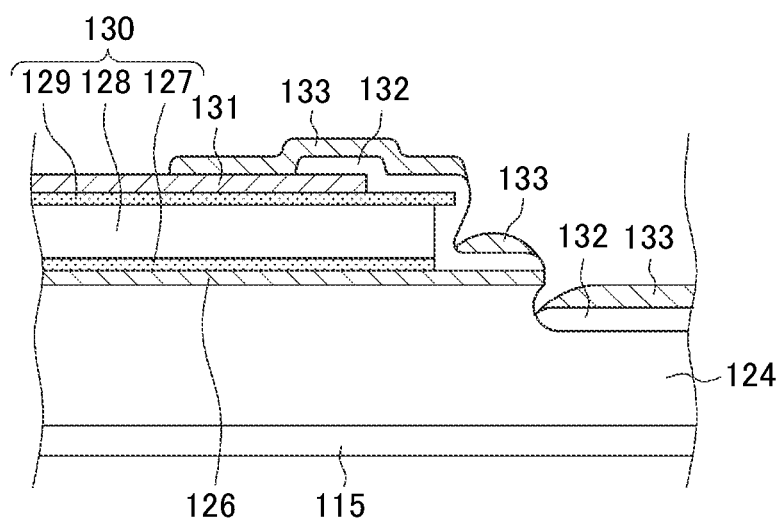
FIG. 6 is a cross-sectional view along the line B-B of FIG. 4.

FIG. 6 is a cross-sectional view taken along line B-B of FIG. 4, showing a second problem and a third problem to be solved by the present invention. In FIG. 6, other than the layer of the problematic portion is omitted. In FIG. 6, a source electrode 119 is formed on the second interlayer insulating film 115, and the source electrode 119 is connected to a cathode 126 formed of Ti via a through hole 125 formed in the organic passivation film 124. An a-Si film 130 as a photoconductive film 130 is formed on a cathode 126, and an anode 131 formed of ITO is formed thereon. A third interlayer insulating film 132 is formed to cover the periphery of the anode 131 and the photoconductive film 130; and a connection electrode 133 is formed on the third interlayer insulating film 132 and a part of the anode 131.

In FIG. 6, a photoconductive film 130 formed of a-Si is patterned by dry etching, but an etching selectivity between an a-Si film 130 and an organic passivation film 124 is further smaller than an etching selectivity ratio between an a-Si film 130 and a Ti film 126. Accordingly, when the a-Si film 130 is dry-etched, the organic passivation film 124 is etched using the Ti film 126, which is a cathode, as a mask (see the right side of FIG. 6). When the third interlayer insulating film 132 and the connection electrode 133 are formed covering the step portion of the organic passivation film 124 formed at this time, the third interlayer insulating film 132 cannot cover this step. In addition, there is a risk of disconnection of the connection electrode 133 due to this step. This is a second problem.

In FIG. 6, a photoconductive film 130 is formed of a p+ layer 129, an a-Si layer (i layer) 128, and an n+ layer 127, and is patterned by dry etching. The etch rate of p+ layer 129 is less than the etch rate of a-Si layer 128 and layer n+ 127. Therefore, after patterning, an overhang of the p+ layer 129 is formed in the photoconductive film 130. Then, when the third interlayer insulating film 132 and the connection electrode 133 are formed covering this, the connection electrode 133 is broken due to an influence of an overhang of the p+ layer 129. This is a third problem.

Hereinafter, a configuration for solving the first problem is explained according to Embodiment 1; a configuration for solving the second problem is explained according to Embodiment 2; and a configuration for solving the third problem is explained according to Embodiment 3.

Embodiment 1

Figure 7:
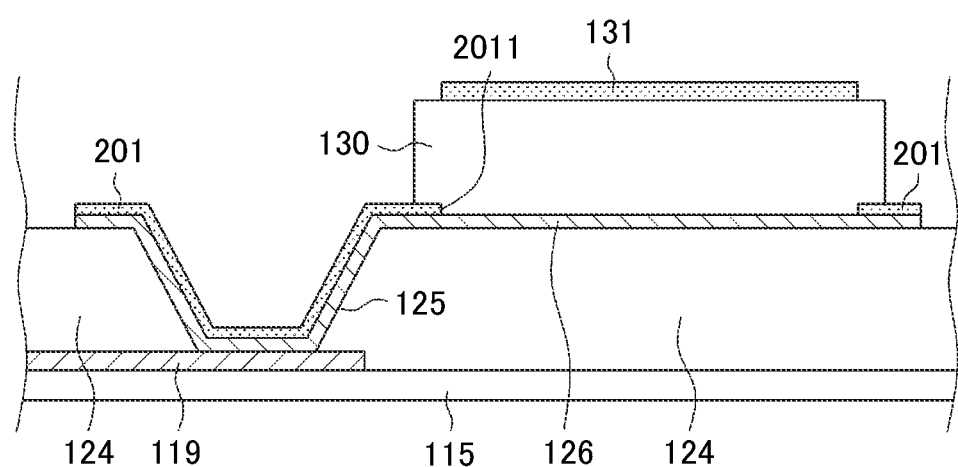
FIG. 7 is a cross-sectional view of structure of Embodiment 1.

FIG. 7 is a cross-sectional view showing a configuration of Embodiment 1 which solves the first problem. FIG. 7 is different from FIG. 5 in that an ITO film 201 is formed over the cathode 126. The ITO film 201 has a thickness of 30 to 50 nm. Since the selective ratio of dry etching between ITO and a-Si is high, the ITO film 201 is hardly etched when the a-Si film 130 is dry-etched. Accordingly, the Ti film 126 which is a lower layer of the cathode is protected, and disconnection of the cathode 126 is prevented.

Figure 8A:
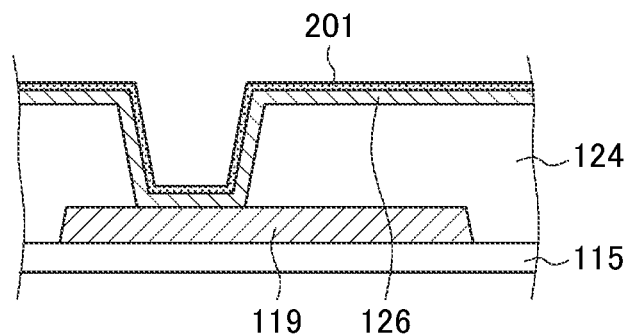
FIG. 8A is a cross-sectional view of a first process of a process flow to realize a structure of Embodiment 1.
Figure 8B:
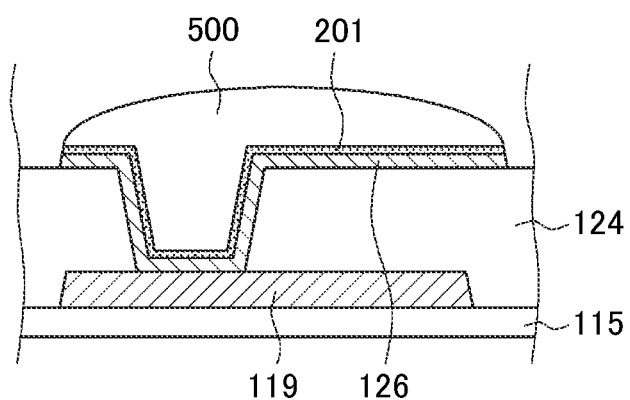
FIG. 8B is a cross-sectional view of a process following the process of FIG. 8A.
Figure 8C:
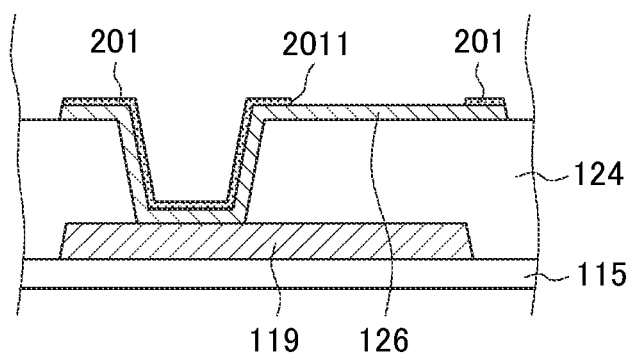
FIG. 8C is a cross-sectional view of a process following the process of FIG. 8B.

However, in order to maintain the characteristics as a photodiode, it is preferable to make the n+ layer 127 and the Ti film 126 in contact with each other. Therefore, the ITO film 201 is removed except for the portion in contact with the peripheral portion of the n+ layer 127 to form the opening portion 2011, and the n+ layer 127 is in contact with the Ti film 126 in the opening portion 2011 of the ITO film 201. However, the ITO film 201 may have a structure in which the opening 2011 is not provided, and the n+ layer 127 and the ITO film 201, which is stacked on the cathode 126, directly contact each other. FIGS. 8A to 8F are cross-sectional views illustrating a process of realizing the configuration of FIG. 7. FIG. 8A is a cross-sectional view showing a state in which an ITO film 201 is formed on a Ti film 126 which is a cathode. FIG. 8B is a cross-sectional view showing a state in which the ITO film 201 and the Ti film 126 other than the vicinity of the photodiode are removed using the resist 500. FIG. 8C is a cross-sectional view showing a state in which the ITO film 201 is removed from a portion where the photoconductive film (a-Si film) 130 is formed.

Figure 8D:
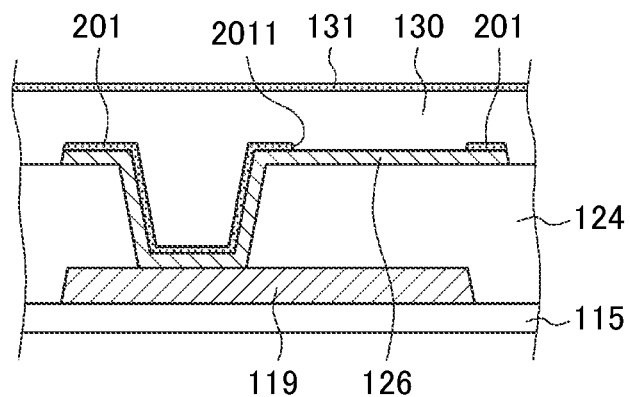
FIG. 8D is a cross-sectional view of a process following the process of FIG. 8C.
Figure 8E:
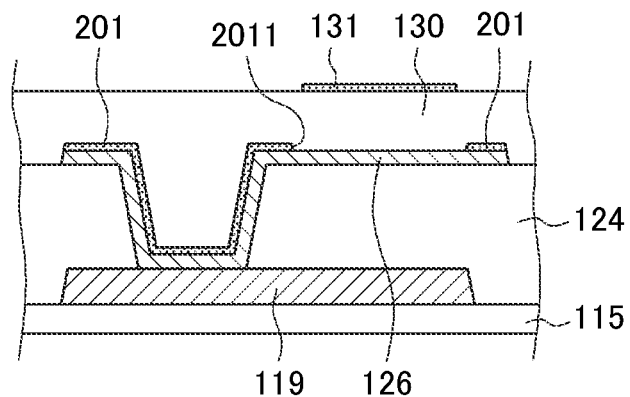
FIG. 8E is a cross-sectional view of a process following the process of FIG. 8D.

FIG. 8D is a cross-sectional view showing a state in which an a-Si film 130 is formed over the cathode 126 and the ITO film 201, and an ITO film 131 serving as an anode 131 is formed thereon. FIG. 8E is a cross-sectional view showing a state in which an anode 131 is formed by patterning an ITO film 131 on a a-Si film 130.

Figure 8F:
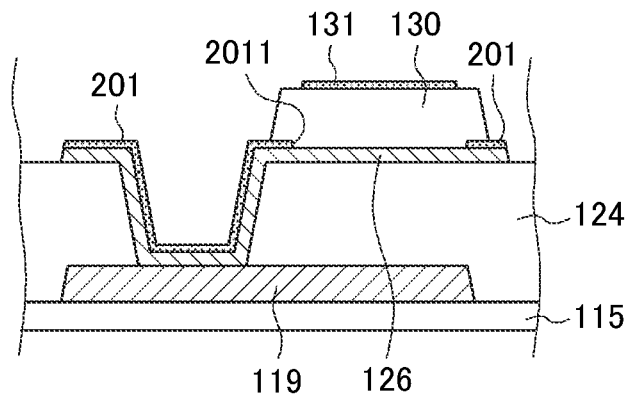
FIG. 8F is a cross-sectional view of a process following the process of FIG. 8E.

FIG. 8F is a cross-sectional view showing a state in which the a-Si film 130 is patterned to form a photoconductive film 130. When the a-Si film 130 is dry-etched, since the etching selectivity between a-Si and ITO is large, the ITO film 201 is hardly affected. Thus, a stable cathode 126 can be formed.

Embodiment 2

Figure 9:
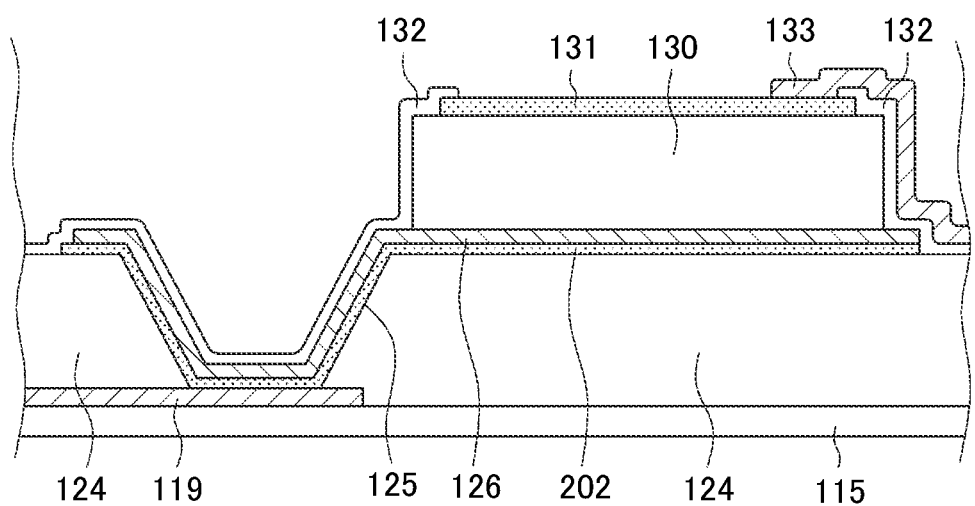
FIG. 9 is a cross-sectional view of a structure of Embodiment 2.

FIG. 9 is a cross-sectional view showing a configuration of Embodiment 2 which solves the second problem. FIG. 9 is different from FIG. 6 in that an ITO film 202 is formed below the cathode 126. The ITO film 202 has a thickness of 30 to 50 nm. The selectivity of dry etching between ITO and a-Si is high. In other words, after patterning the Ti film 126 as the cathode 126, the ITO film 202 as a lower layer is left, and the a-Si film 130 as the photoconductive film 130 is patterned in this state. At this time, since the organic passivation film 124 is protected by the ITO film 202, it is not dry-etched. Therefore, forming a step of the organic passivation film 124, generated when the a-Si film 130 is dry etched, can be avoided. Then, after the a-Si film 130 is dry-etched, the ITO film 202 is patterned.

Figure 10A:
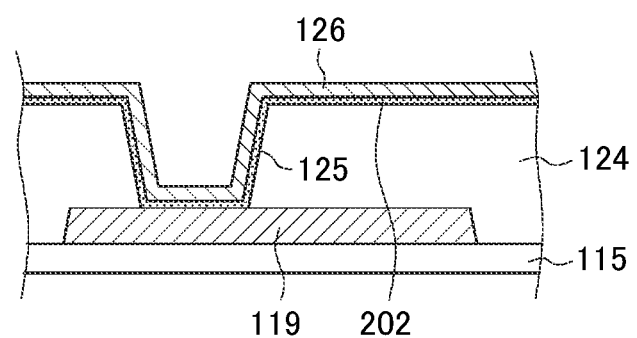
FIG. 10A is a cross-sectional view of a first process of a first process flow to realize a structure of Embodiment 2.
Figure 10B:
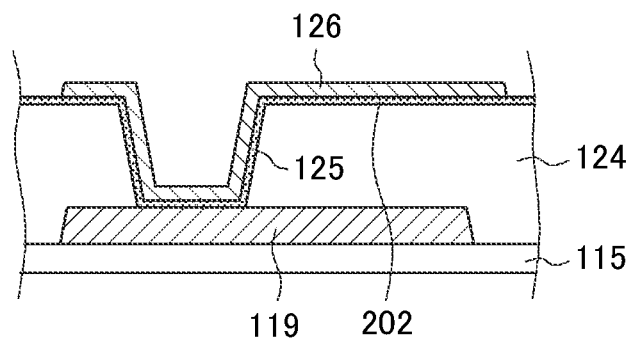
FIG. 10B is a cross-sectional view of a process following the process of FIG. 10A.

FIGS. 10A, 10B, and 11A to 11C are cross-sectional views illustrating a first example of a process flow for realizing the configuration of FIG. 9. In FIG. 10A, an organic passivation film 124 is formed covering the second interlayer insulating film 115 and the source electrode 119; and a through hole 125 is formed in the organic passivation film 124. An ITO film 202 and a cathode 126 made of a Ti film are formed covering the organic passivation film 124 and the through hole 125. FIG. 10B is a cross-sectional view showing a state in which only the cathode 126 on the ITO film 202 is patterned.

Figure 11A:
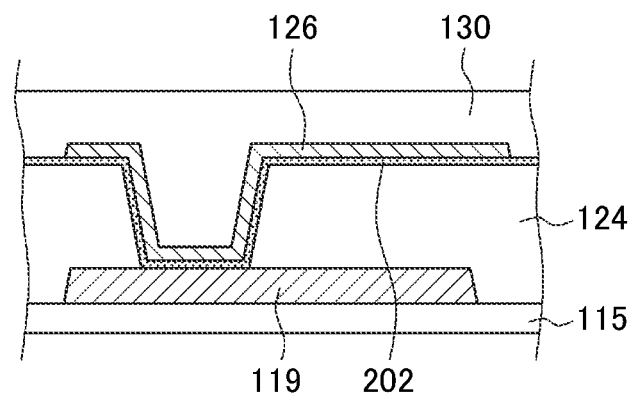
FIG. 11A is a cross-sectional view of a process following the process of FIG. 10B in a first process flow.
Figure 11B:
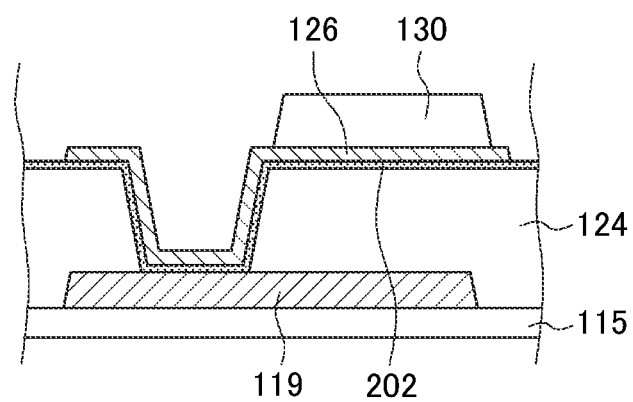
FIG. 11B is a cross-sectional view of a process following the process of FIG. 11A in the first process flow.

FIG. 11A is a cross-sectional view showing a state in which an a-Si film 130 which is a photoconductive film is formed over the ITO film 202 and the cathode 126. FIG. 11B is a cross-sectional view showing a state in which an a-Si film 130, which is a photoconductive film, is patterned. When the a-Si film 130 is patterned, since the organic passivation film 124 is covered with the ITO film 202, it is not dry-etched, and therefore, no step is formed. Thereafter, the ITO film 202 is patterned. The ITO film 202 is patterned into substantially the same shape as the cathode 126.

Figure 11C:
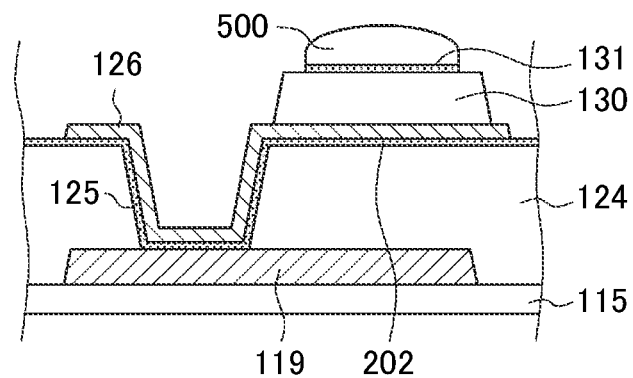
FIG. 11C is a cross-sectional view of a process following the process of FIG. 11B in the first process flow.

FIG. 11C is a cross-sectional view showing a state in which an ITO film 131 serving as an anode is formed over the photoconductive film 130, and then the anode 131 is patterned using a resist 500. At this time, the ITO film 202 is also patterned using the Ti film 126 as a cathode as a mask. As described above, according to the first process flow, it is possible to prevent a step from being generated in the organic passivation film 124 and to prevent the connection electrode 133 from being broken.

Figure 12A:
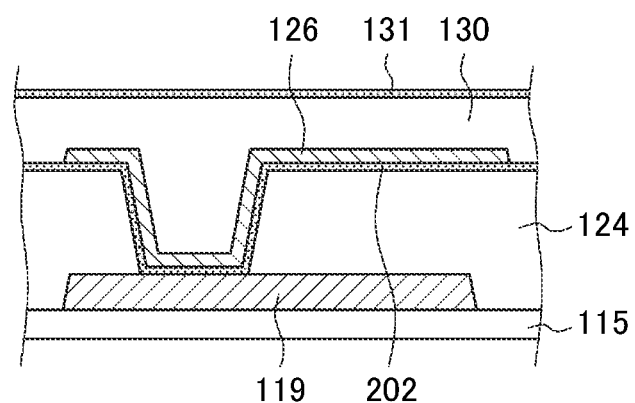
FIG. 12A is a cross-sectional view of a process following the process of FIG. 10B in a second process flow.

FIGS. 10A, 10B, and 12A to 12D are cross-sectional views illustrating a second example of a process flow for realizing the configuration of FIG. 9. FIGS. 10A and 10B are as described in the first process flow. FIG. 12A is a cross-sectional view showing a state in which an a-Si film 130 serving as a photoconductive film is formed over an ITO film 202 and a cathode 126 formed of Ti, and an ITO film 131 serving as an anode is formed thereon.

Figure 12B:
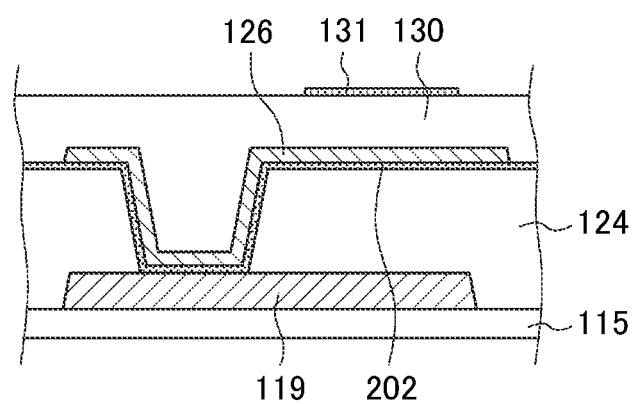
FIG. 12B is a cross-sectional view of a process following the process of FIG. 12A in the second process flow.
Figure 12C:
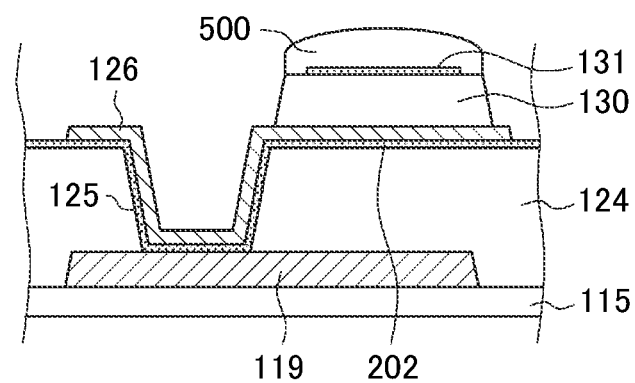
FIG. 12C is a cross-sectional view of a process following the process of FIG. 12B in the second process flow.

FIG. 12B is a cross-sectional view showing a state in which an anode 131 is formed by patterning an ITO film 131. FIG. 12C is a cross-sectional view showing a state in which the resist 500 is formed and the a-Si film 130 is patterned. Thereafter, the ITO film 202 is patterned using the Ti film 126, which is a cathode, as a resist. Since the ITO film 202 and the organic passivation film 124 have a large selection ratio, the organic passivation film 124 is not etched in patterning the ITO film 202.

Figure 12D:
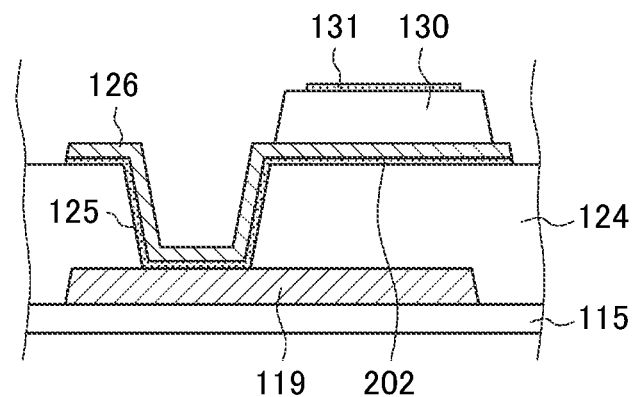
FIG. 12D is a cross-sectional view of a process following the process of FIG. 12C in the second process flow.

FIG. 12D is a cross-sectional view showing a state in which the resist 500 on the anode 131 is removed. As shown in FIG. 12D, also in the second process flow, it is possible to realize a configuration as shown in FIG. 9, thereby preventing disconnection of the connection electrode and improving reliability of the photo sensor.

Embodiment 3

Figure 13:
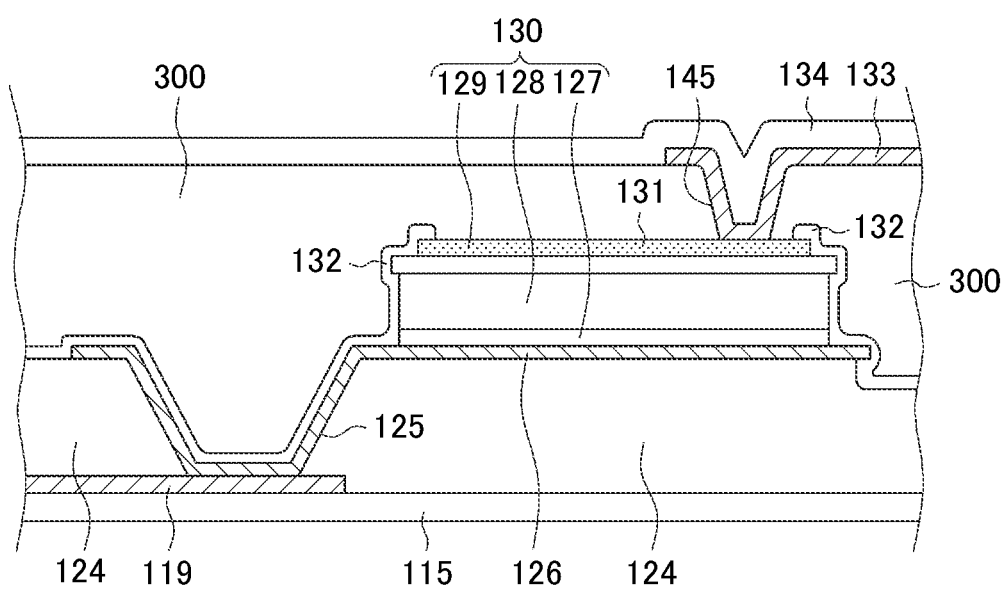
FIG. 13 is a cross-sectional view of a structure of Embodiment 3.

FIG. 13 is a cross-sectional view showing a configuration of Embodiment 3 which solves the third problem. FIG. 13 differs from FIG. 6 in that an organic insulating film 300 is formed covering the anode 131 and the third interlayer insulating film 132, and the connecting electrode 133 is connected to the anode 131 through a through hole 145 formed in the organic insulating film 300.

Since the thickness of the organic insulating film 300 is about 2 µm, the surface is leveled, and the influence of an eaves or the like of the p+ layer 129 formed on the photoconductive film 130 does not affect the connection electrode 133. Accordingly, disconnection of the connection electrode 133 can be prevented. In the configuration shown in FIG. 13, the second problem, i.e., the influence of the step caused by the etching of the organic passivation film 124 at the end of the Ti film 126, which is a cathode, can be eliminated. This is because the step formed in the organic passivation film 124 is also covered with the organic insulating film 300. In other words, the configuration shown in FIG. 13 can simultaneously cope with the second and third problems.

Figure 14A:
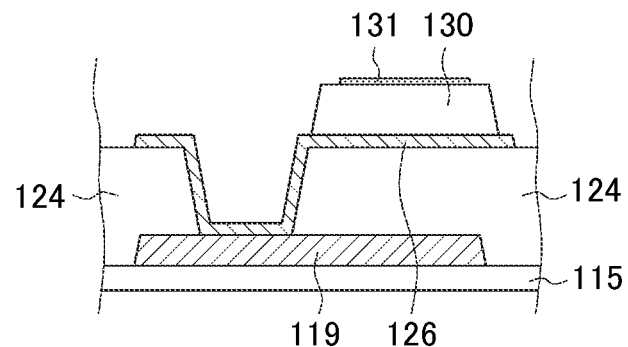
FIG. 14A is a cross-sectional view of a first process of a process flow to realize a structure of Embodiment 3.
Figure 14B:
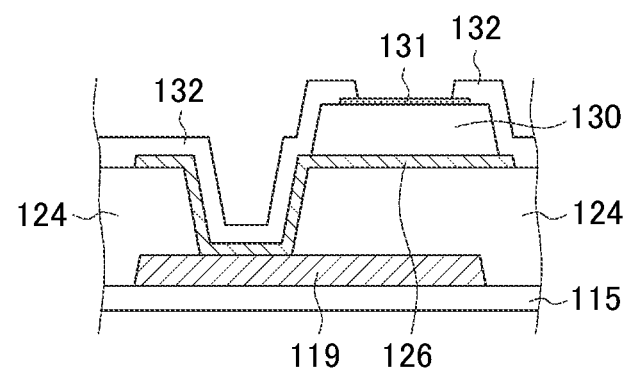
FIG. 14B is a cross-sectional view of a process following the process of FIG. 14A.

FIGS. 14A to 14E are process flow for realizing the configuration of FIG. 13. FIG. 14A is a sectional view showing a state in which an a-Si film 130 which is a photoconductive film 130 is formed on a cathode 126, which is formed on an organic passivation film 124, and an anode 131 is formed on the photoconductive film 130. FIG. 14B is a cross-sectional view showing a state in which a third interlayer insulating film 132 is formed covering an organic passivation film 124, a cathode 126, an a-Si film 130, and a portion of an anode 131.

Figure 14C:
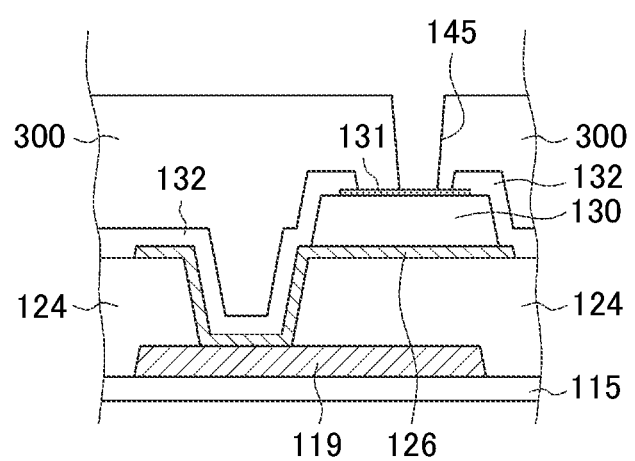
FIG. 14C is a cross-sectional view of a process following the process of FIG. 14B.

FIG. 14C is a cross-sectional view showing a state in which an organic insulating film 300 is formed covering the third interlayer insulating film 132 and the anode 131, and the through hole 145 is formed in the organic insulating film 300 at a portion corresponding to the anode 131. As shown in FIG. 14C, since an end portion of the a-Si film 130 and an end portion of the cathode 126 are covered with an organic insulating film 300, even if an irregular shape is generated at this portion, there is no influence on the surface of the organic insulating film 300 where the connecting electrode 133 is formed.

Figure 14D:
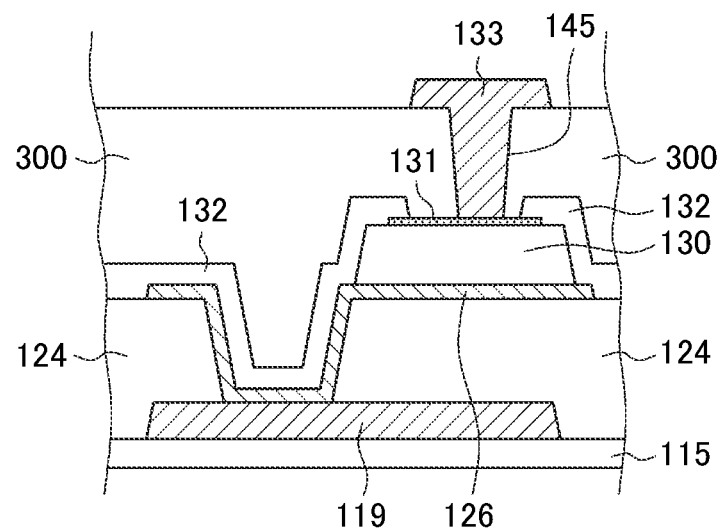
FIG. 14D is a cross-sectional view of a process following the process of FIG. 14C.
Figure 14E:
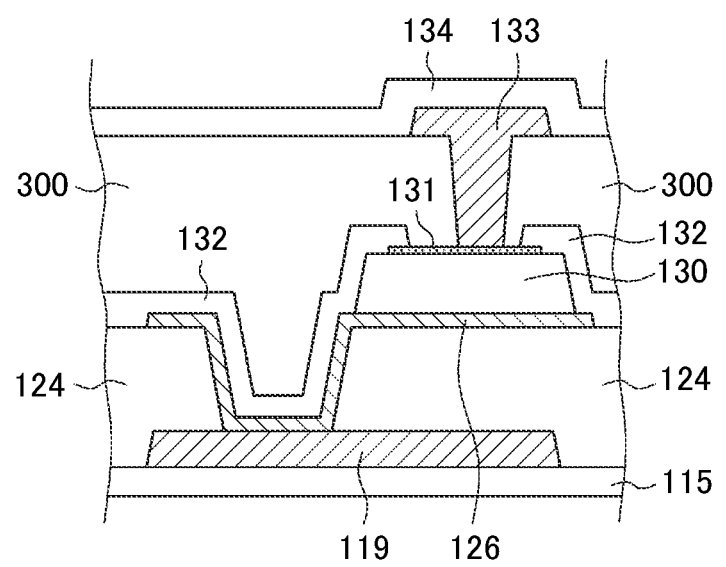
FIG. 14E is a cross-sectional view of a process following the process of FIG. 14D.

FIG. 14D is a cross-sectional view showing a state in which the connection electrode 133 is formed in the through-hole 145 formed in the organic insulating film 300. Since the surface of the organic insulating film 300 is leveled and flattened, no disconnection occurs in the connecting electrode 133. Thereafter, as shown in FIG. 14E, the entire photo sensor is protected by an inorganic passivation film 134. Thus, a highly reliable photo sensor shown in FIG. 13 can be realized.

Figure 15:
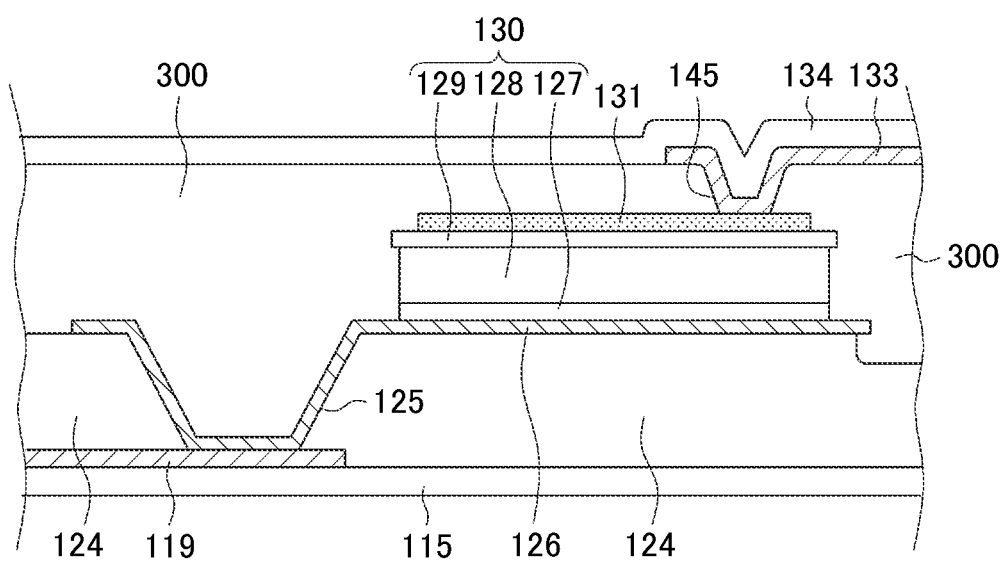
FIG. 15 is a cross-sectional view of another structure of Embodiment 3.

FIG. 15 is a modification of FIG. 13. FIG. 15 is different from FIG. 13 in that there is no third interlayer insulating film 132 formed of an inorganic film such as SiN covering the a-Si film 130, the anode 131, the organic passivation film 124, and the like. If impurities such as moisture generated from the organic passivation film 124 or the like do not contaminate the a-Si film or the like which is the photoconductive film 130, the third interlayer insulating film 132 can be omitted.

The configuration of FIG. 15 can be formed by a process flow such as that of FIGS. 14A, and 14C to 14E, except that the step of FIG. 14B is not necessary. In the configuration shown in FIG. 15, the process of forming the third interlayer insulating film is unnecessary, and thus the manufacturing cost can be reduced compared with the configuration of FIG. 13.

What is claimed is:

1. A semiconductor device including an optical sensor, the optical sensor comprising:
a thin film transistor formed on a substrate, and
a photo diode formed above the thin film transistor,
wherein the photo diode includes an anode, a photo conductive film and a cathode,
the cathode is constituted from a titanium film,
a first transparent conductive film is formed between the titanium film and the photo conductive film, and
an outer edge of the anode is within an outer edge of the photo diode.

2. The semiconductor device according to claim 1,
wherein the photoconductive film is made of an a-Si film having an n+ layer, an i layer (intrinsic layer), and a p+ layer from the cathode side.

3. The semiconductor device according to claim 2,
wherein the first transparent conductive film has an opening portion at a position overlapping with the photoconductive film, and the n+ layer and the cathode are in direct contact with each other at the opening portion.

4. The semiconductor device according to claim 1,
wherein the first transparent conductive film has a first portion which overlaps with the photo conductive film, and a second portion which does not overlap with the photo conductive film.

5. The semiconductor device according to claim 1,
wherein the anode is formed from a second transparent conductive film.

6. The semiconductor device according to claim 1,
wherein the first transparent conductive film is located outside the outer edge of the photo diode.

7. A semiconductor device including an optical sensor, the optical sensor comprising:
a thin film transistor formed on a substrate, and
a photo diode formed above the thin film transistor,
wherein the photo diode includes an anode, a photo conductive film and a cathode,
the cathode is constituted from a titanium film,
the titanium film contacts a first transparent conductive film,
the titanium film is formed between the first transparent conductive film and the photo conductive film,
an outer edge of the anode is within an outer edge of the photo diode.

8. The semiconductor device according to claim 7,
wherein the photoconductive film is made of an a-Si film having an n+ layer, an i layer (intrinsic layer), and a p+ layer from the cathode side.

9. The semiconductor device according to claim 7,
wherein an organic passivation film is formed under the first transparent conductive film, and
the first transparent conductive film is sandwiched between the organic passivation film and the cathode, and overlaps with the photo conductive film.

10. The semiconductor device according to claim 9,
further including an oxide semiconductor and a source electrode connected to the oxide semiconductor,
wherein the source electrode is in direct contact with the first transparent conductive film via a contact hole formed in the organic passivation film.

11. The semiconductor device according to claim 7,
wherein the anode is formed from a second transparent conductive film.

12. The semiconductor device according to claim 7,
wherein a part of the anode is covered by an inorganic passivation film, and
the anode is connected to a connecting electrode which extends on the inorganic passivation film.

13. The semiconductor device according to claim 7,
wherein a side of the photo diode, a part of the anode, and a side of the contact hole is continuously covered with an isolation layer.

14. The semiconductor device according to claim 13,
wherein the isolation layer includes an opening overlapping the anode, and a connection electrode is connected to the anode at a part of the opening.

15. A semiconductor device including an optical sensor, the optical sensor comprising:
a thin film transistor formed on a substrate, and
a photo diode formed above the thin film transistor,
wherein the photo diode includes an anode, a photo conductive film and a cathode,
a first organic passivation film is formed covering a part of the anode,
a connecting electrode, which extends on the first organic passivation film, connects to the anode, and
an outer edge of the anode is within an outer edge of the photo diode.

16. The semiconductor device according to claim 15,
wherein the photoconductive film is made of an a-Si film having an n+ layer, an i layer (intrinsic layer), and a p+ layer from the cathode side.

17. The semiconductor device according to claim 15,
wherein the cathode is formed from titanium, and
a second organic passivation is formed under the cathode.

18. The semiconductor device according to claim 15,
wherein an inorganic passivation film is formed on a part of the photo conductive film and a part of the anode, and under the first organic passivation.

* * * * *